United States Patent [19]

Iwahashi et al.

[11] Patent Number: 4,571,706
[45] Date of Patent: Feb. 18, 1986

[54] SEMICONDUCTOR MEMORY DEVICE

[75] Inventors: Hiroshi Iwahashi, Yokohama; Shoji Ariizumi, Tokyo, both of Japan

[73] Assignee: Tokyo Shibaura Denki Kabushiki Kaisha, Japan

[21] Appl. No.: 477,882

[22] Filed: Mar. 23, 1983

[30] Foreign Application Priority Data

Mar. 25, 1982 [JP] Japan .................................. 57-47722
Mar. 25, 1982 [JP] Japan .................................. 57-47724
Apr. 5, 1982 [JP] Japan .................................. 57-56278

[51] Int. Cl.⁴ .............................................. G11C 7/00
[52] U.S. Cl. .................................................... 365/200
[58] Field of Search .......................... 365/200; 371/10

[56] References Cited

U.S. PATENT DOCUMENTS 3,940,740 2/1976 Coontz .................................. 365/200
4,399,372 8/1983 Tanimoto et al. ............... 365/200 X

OTHER PUBLICATIONS

Kokkonen et al., "Redundancy Techniques for Fast Static RAMs", ISSCC Digest of Technical Papers, pp. 80-81, Feb. 18, 1981.

*Primary Examiner*—Joseph A. Popek
*Attorney, Agent, or Firm*—Finnegan, Henderson, Farabow, Garrett & Dunner

[57] ABSTRACT

A semiconductor memory device is disclosed in which, when a main memory contains an error bit cell, the main memory is switched to an auxiliary memory by cutting off an interconnection wire between a decoder and the main memory, and subjecting a high resistance polysilicon connected between the decoder and the auxiliary memory to laser annealing to reduce the resistance of the high resistance polysilicon and to connect the decoder and the auxiliary memory.

21 Claims, 23 Drawing Figures

F I G. 4 *PRIOR ART*
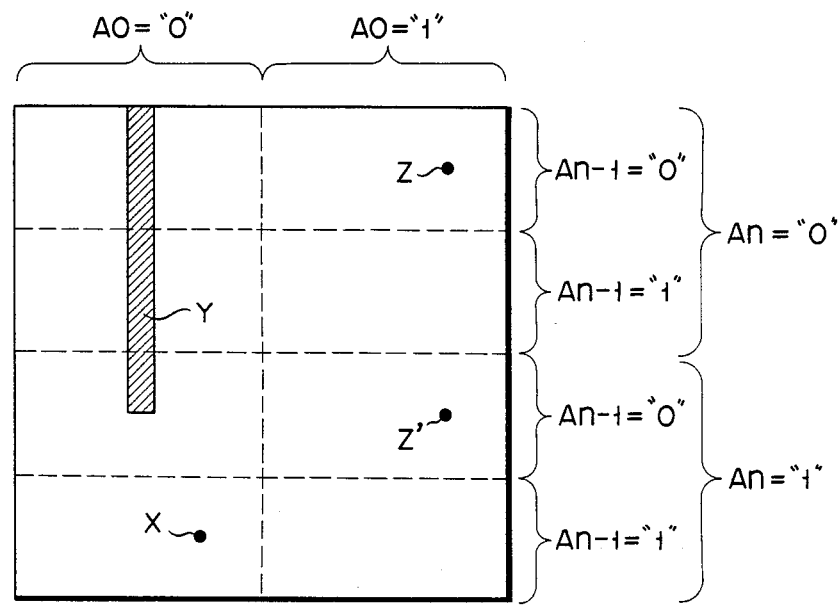
F I G. 5 *PRIOR ART*
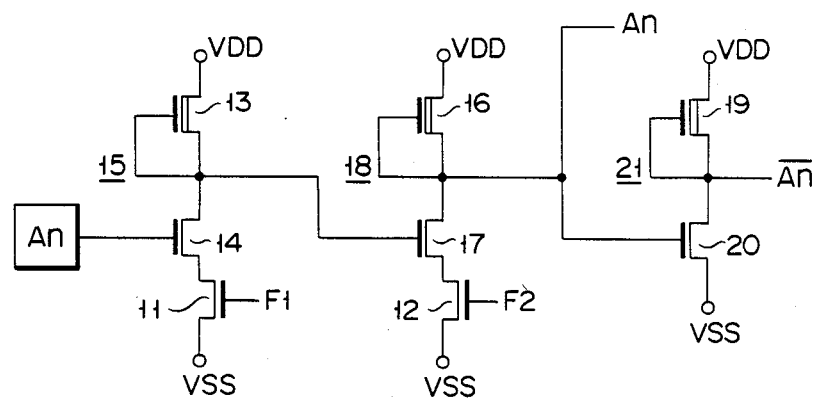

F I G. 21
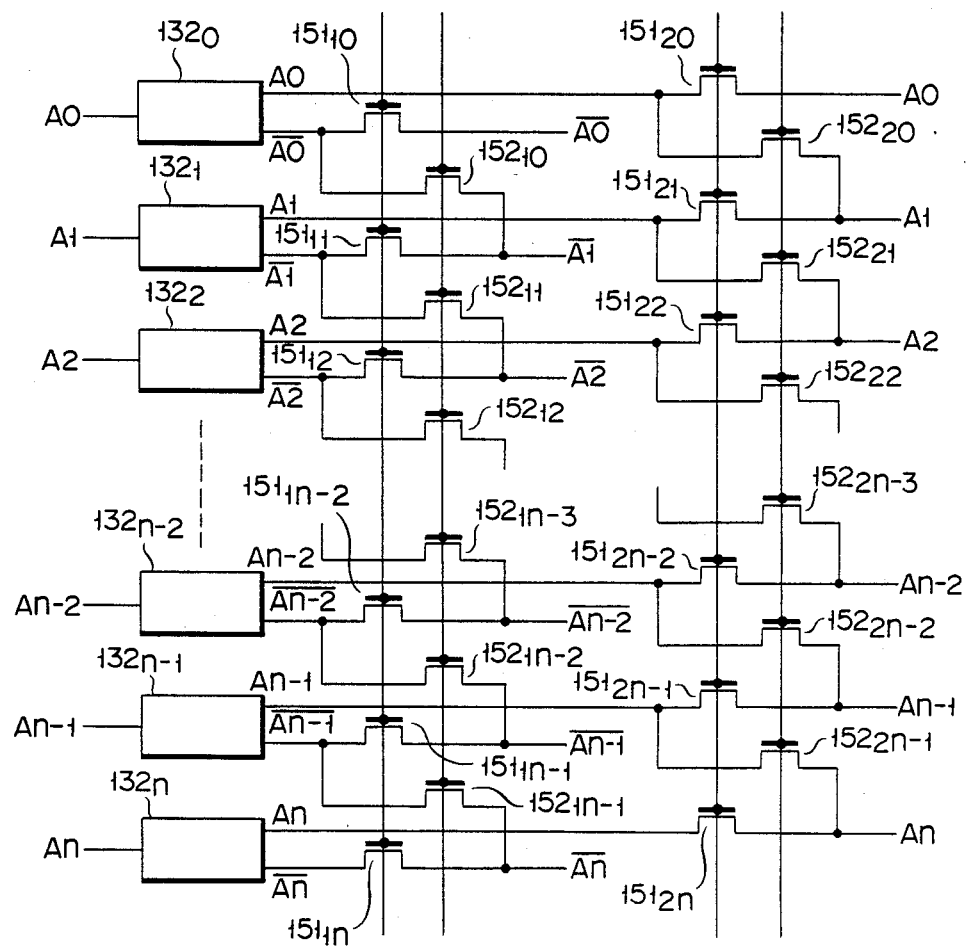

SEMICONDUCTOR MEMORY DEVICE

BACKGROUND OF THE INVENTION

The present invention relates to semiconductor memory devices with improved production yields.

With the increase of memory capacity in the fabrication of recent semiconductor memory devices, the probability of the occurrence of error bit cells has also increased. Conventionally, semiconductor memory devices containing error bit cells have been discarded as defective devices. The discarding of the defective devices is very uneconomical, and also leads to an increase in the manufacturing cost. Some measures taken to solve this problem have succeeded in overcoming such uneconomical manufacturing methods. One of the successful measures employs a memory device with a redundancy function. Specifically, an auxiliary memory is used in addition to a main memory. When the main memory contains an error bit cell, a drive or select line, on which bit cells including the error bit are arranged, is selected and all of the bit cells including the error bit cell are replaced with the correct bit cells arrayed on a select line of the auxiliary memory.

FIG. 1 shows in block form an example of such a semiconductor memory device. In FIG. 1, reference numeral 1 designates an address buffer whose output is applied to a main address decoder 2 and an auxiliary decoder 3. The output signal from the main address decoder 2 is applied to a main memory 4 to select one of the row lines in the main memory 4. Subsequently, data may be written, by a write signal, into specified memory bit cells connected to the selected row line. Similarly, the data may be read out therefrom by a read signal. The main address decoder 2 is controlled by an output signal from the auxiliary address decoder 3. The decoder output of the auxiliary address decoder 3 is applied to an auxiliary memory 5. The signal selects one row line of the auxiliary memory 5. Then, data may be written into memory cells connected to the row line by a write signal, and read out therefrom by a read signal. The auxiliary address decoder 3 is programmed so as to produce an output signal representing an address of a memory area containing an error bit cell in the main memory.

A control signal generating circuit 6 generates a control signal for the auxiliary decoder 3 when an error bit cell is found in the main memory 4. The control signal controls the auxiliary address decoder 3 so as to replace a specific number of bit cells including the error bit cell with the corresponding number of correct bit cells in the auxiliary memory 5. The specific number of bit cells are those arrayed on a select or drive line, having the error bit cell connected thereto, of the main or auxiliary memory. This circuit 6 is composed of a nonvolatile memory, so programmed that it drives the auxiliary address decoder 3 to access the auxiliary memory 5 when the error bit cell is found.

When the main memory 4 does not contain an error bit cell, this control circuit 6 does not operate, and the main address decoder 2 accesses the main memory 4.

On the other hand, when the main memory 4 has an error bit cell and is accessed, the control signal generating circuit 6 drives the auxiliary address decoder 3 to access the auxiliary memory 5, and at the same time to stop the operation of the main address decoder 2. In this way, the error bit cell in the main memory 4 is replaced with the correct bit cell of the auxiliary memory 5.

FIGS. 2A and 2B show practical circuit diagrams of two examples of the control signal generator 6. In the circuit shown in FIG. 2A, a fuse element F made of polysilicon or the like is inserted between a power source VD terminal and an output terminal OUT. A programming enhancement type MOS transistor 7 is connected between the output terminal OUT and a ground. A depletion type MOS transistor 8 is inserted between the output terminal OUT and a ground. A programming signal P is applied to the gate of the MOS transistor 7. The gate of the MOS transistor 8 is connected to a ground. In the circuit shown in FIG. 2B, the power source VD and the output terminal OUT have a programming enhancement type MOS transistor 7 and a depletion type MOS transistor 8, which are connected in parallel therebetween. A fuse element F is inserted between the output terminal OUT and a ground. A programming signal P is applied to the gate of the MOS transistor 7 and the gate of the MOS transistor 8 is connected to the output terminal OUT.

In the circuit shown in FIG. 2A, when the fuse element F is not burned out, a signal level at the output terminal OUT is logical "1" since the resistance ratio of the MOS transistor 8 and the fuse element F is very large. However, when it is burned out, the output terminal OUT is grounded through the MOS transistor 8 and becomes logical "0". In order to burn out the fuse element F, a programming signal P of logical "1" is applied to the gate of the MOS transistor 7. Then, the MOS transistor 7 turns on to allow a large current to flow into the fuse element F. The large current generates Joule heat which in turn burns out the fuse element F. When the fuse element F is burned out, the signal P returns to logical "0" to turn off the transistor 7. The signal at the output terminal OUT, or the control signal from the control signal generator 6, is logical "1", for example, and at this time the decoding operation of the auxiliary address decoder 3 stops. The decoding operation is performed only when the signal at the output terminal OUT is logical "0".

In the circuit of FIG. 2B, when the fuse element F is not burned out, the signal level at the output terminal OUT is kept at logical "0", unlike the circuit of FIG. 2A, since the resistance ratio of the MOS transistor 8 and the fuse element F is very large. On the other hand, when it is burned out, the output terminal OUT is connected to the power source VD terminal through the MOS transistor 8, and is logical "1". In order to burn the fuse element F, a programming signal P of logical "1" is applied to the gate of the MOS transistor 7. At this time, the transistor 7 is turned on, as in the above case, to allow a large current to flow into the fuse element F. In this circuit, when the signal at the output terminal OUT, or a control signal, is logical "0", the decoding operation of the auxiliary address decoder 3 is stopped. When it is logical "1", the decoding operation is executed.

FIG. 3 shows a circuit diagram of an example of the auxiliary address decoder 3 when the control signal generator 6 is not used. The auxiliary address decoder 3 is comprised of a depletion type MOS transistor 9 for a load, a plurality of enhancement type MOS transistors 10 for driving the auxiliary memory whose gates are coupled with an address signal or data A0, $\overline{A0}$, ..., An, $\overline{An}$, and a plurality of fuse elements FB inserted between each of the transistors 10 and the transistor 9.

The auxiliary address decoder 3 is so programmed that when the memory cell in the main memory 4 which is specified by an address signal $A0=Al=\ldots=An=0$, is an error bit cell, the decoder 3 produces a signal designating this address. This programming is done by burning the fuse elements FB connected to the transistors 10 coupled with the address signals $\overline{A0}$ to $\overline{An}$. The auxiliary address decoder 3 thus programmed responds to the address signal $A0=Al=\ldots=An=0$ to access the auxiliary memory 5.

In the auxiliary address decoder 3 shown in FIG. 3, in order to access the auxiliary memory 5, a plurality of fuse elements FB must be burned out, which are selected according to the code of the address signal applied thereto. A laser beam or Joule heat is used to burn out these fuse elements. This burning means, has some problems, however: welded material attached to its peripheral circuit reduces the reliability of the memory device, the failure of burning causes erroneous programming, and reliability on the burned locations is poor. In this respect, it is evident that the fewer the burning locations of the fuse elements, the better. With the remarkable progress of recent microelectronics technology, memory capacity has increased together with the number of bits of an address input signal. Accordingly, the number of fuse elements burned out in the auxiliary memory also increases. For this reason, there is a pressing need to solve the above problems.

There is another method for solving this error bit cell problem of the main memory. In this method, when an error bit cell is found in a memory area specified by, for example, at the most significant bit (MSB) $An=0$ in the address signal, the MSB An of an address signal from the address buffer is fixed at "0" or "1" irrespective of the contents of the input address signal to the address buffer. The main memory is used as a memory with half the capacity of the main memory having no error bit cell. According to this measure, when an error bit cell is contained in the memory of 16 kilo bits, for example, it can be used as a memory of 8 kilo bits by fixing the MSB of the output address signal from the address buffer at "1" or "0".

FIG. 4 shows a memory array of a memory of 16 kilo bits. The upper half of the memory array is selected by the MSB of the address signal $An="0"$ and the lower half area by the MSB $An="1"$. It is assumed that the memory bit cell at point X is defective in FIG. 4. If the MSB An is fixed at "0", $An="0"$, the memory area specified by $An="1"$ and containing the error bit cell is not selected. Thus, the memory of 16 kilo bits can be used as a memory of 8 kilo bits. A practical arrangement of an address decoder for fixing the MSB An of an address signal at "0", which has thus far been used, is illustrated in FIG. 5. This circuit is an address buffer of the type which receives an address signal An and produces address signals An and $\overline{An}$. In FIG. 5, when the control signals F1 and F2 are both "1", MOSFETs 11 and 12 are both turned on. The input address signal An is inverted by an inverter 15 composed of a load MOSFET 13 and a drive MOSFET 14. The inverted signal is again inverted by an inverter 18 composed of a load MOSFET 16 and a drive MOSFET 17 to be an inverted address signal An. This address signal is further applied to an inverter 21 composed of a load MOSFET 19 and a drive MOSFET 20 to be an address signal $\overline{An}$. In case where the address buffer is applied for the above-mentioned memory array, if an error bit cell is found in the memory area selected by $An="1"$, a control signal F1 is set to "0" and another control signal F2 is set to "1". In this condition, the MOSFET 11 is always in an OFF state, so that $\overline{An}$ is "1" and $An="0"$. If the input address signal An to the address buffer takes any logical level, the error bit cell is not selected.

As described above, the main memory containing the error bit cell can be used as a memory having only half the capacity of the main memory, by fixing the MSB of the output signal from the address buffer at "1" or "0". Therefore, the production yield of the memory devices is improved.

The method mentioned above, in which the MSB of the output address signal is fixed at "1" or "0", is ineffective when error bit cells are present in both the memory areas selected by the MSB $An="0"$ and "1", for example, in the memory area hatched and denoted as Y in FIG. 4. The same thing is true for a case in which the error bit memory is located at point Z in the area selected by the MSB $An="0"$ and at point Z' selected by the MSB $An="1"$.

Thus, the circuit as shown in FIG. 5 can only cope with a defective memory in which the error bit cell is located at the memory area selected by the MSB $An="0"$ or "1". Thus, this circuit still involves the problem of low production yield.

SUMMARY OF THE INVENTION

Accordingly, an object of the present invention is to provide a semiconductor memory device which, when a main memory contains an error bit cell, can replace a specific number of bit cells including the error bit cell in the main memory with the corresponding number of correct bit cells in an auxiliary memory in a simple manner, thereby improving the production yield of semiconductor devices.

Another object of the present invention is to provide a semiconductor memory device which can save a memory containing an error bit irrespective of the location of the error bit cell, or can effectively use such a memory without discarding it, thereby improving the production yield of semiconductor devices.

According to the invention, there is provided a semiconductor memory device comprising:

a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell; and
means for preventing said decoder from accessing the error bit cell in said main memory.

According to the invention, there is further provided a semiconductor memory device comprising:

a main memory;
a decoder for accessing said main memory;
an auxiliary memory serving as an auxiliary for said main memory;
means for cutting off an interconnection wire between said decoder and said main memory; and
connection means for connecting said decoder and said auxiliary memory.

According to the invention, there is still further provide a semiconductor memory device comprising:

a main memory;
a decoder for accessing said main memory;

an auxiliary memory serving as an auxiliary for said main memory;

impedance means provided between said auxiliary memory and said decoder, which responds to the output signal from said decoder to allow said auxiliary memory to be accessed; and means for changing impedance of said impedance means which is selected for accessing said auxiliary memory.

According to the invention, there is further provided a semiconductor memory device comprising:

a main memory;

a decoder for accessing said main memory;

a plurality of transfer paths provided between said decoder, said main memory and said auxiliary memory;

first switch means provided between input and output of each of said transfer paths, said first switch means being in a closed state;

second switch means provided between the input of one of each pair of said adjacent transfer paths and the output of the other of said transfer path pair, said paired transfer paths being displaced by one bit, said second switch means being in an open state; and first circuit means for setting in an open state those of said plurality of first switch means, which are provided to those of the transfer paths which are between a given transfer path connected to said main memory and the transfer path connected to said auxiliary memory, and the first circuit means for setting in a closed state those of said plurality of second switch means which are provided between said transfer paths.

According to the invention, there is further provided a semiconductor memory device comprising:

a main memory;

a decoder for accessing said main memory;

an auxiliary memory serving as an auxiliary for said main memory;

first means for changing to another address an address of some memory cells of said main memory which are selected by said decoder when said auxiliary memory is not used, and when said main memory contains an error bit cell and said auxiliary memory is used; and second means for prohibiting use of said error bit cell when said auxiliary memory is used.

According to the invention, there is further provided a semiconductor memory device comprising:

first switch means provided between the input and output of each of transfer paths through which bit signals of each address having a plurality of bits are transferred, said first switch means being in a closed state;

second switch means provided between the input of one of pairs of said adjacent transfer paths through which two address data displaced one bit are transferred, and the output of the other of said paired transfer paths, said second switch means being in a closed state;

means for setting in an open state said second switch means of said first and second switch means which is provided to said transfer paths ranging from said transfer path through which a bit signal is transferred to said transfer path through which a bit signal corresponding to the most significant bit is transferred, and for setting said second switch means in a closed state; and means for fixing output data from said transfer path through which said bit signal is transferred to a predetermined level.

BRIEF DESCRIPTION OF THE DRAWINGS

FIG. 4 schematically illustrates a main memory array containing error bit cells;

FIG. 5 is a circuit arrangement of an address decoder for fixing the contents of the output data;

FIGS. 20 and 21 show circuit diagrams of additional embodiments of the present invention.

DETAILED DESCRIPTION OF THE PFEFERRED EMBODIMENTS

Figure 1:
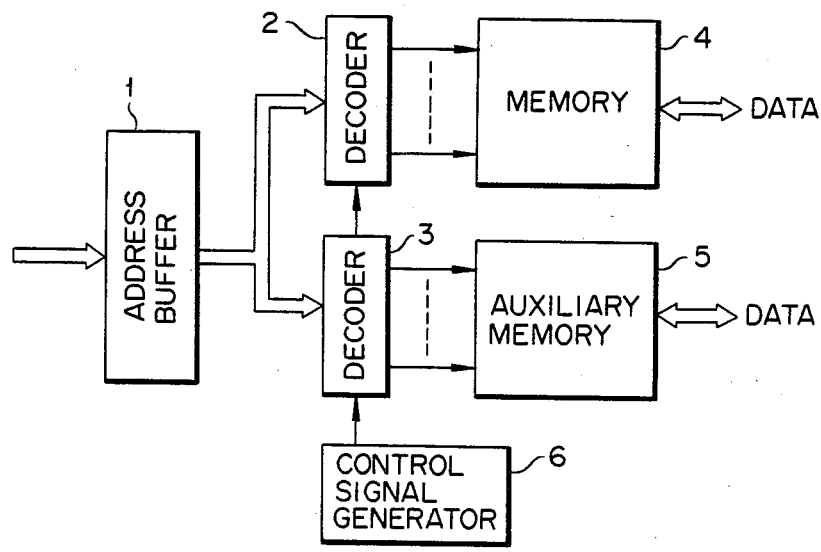
FIG. 1 shows a block diagram of a conventional semiconductor memory device containing an auxiliary memory.
Figure 2A:
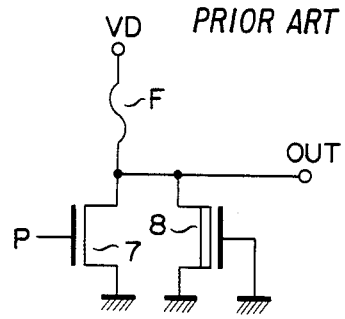
FIGS. 2A and 2B show two examples of a practical arrangement of a control signal generator included in the memory device shown in FIG. 1.
Figure 2B:
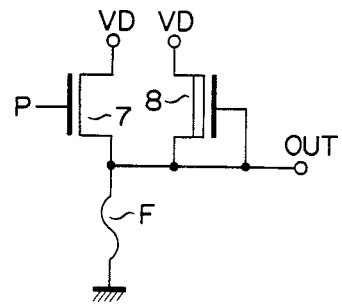
Figure 3:
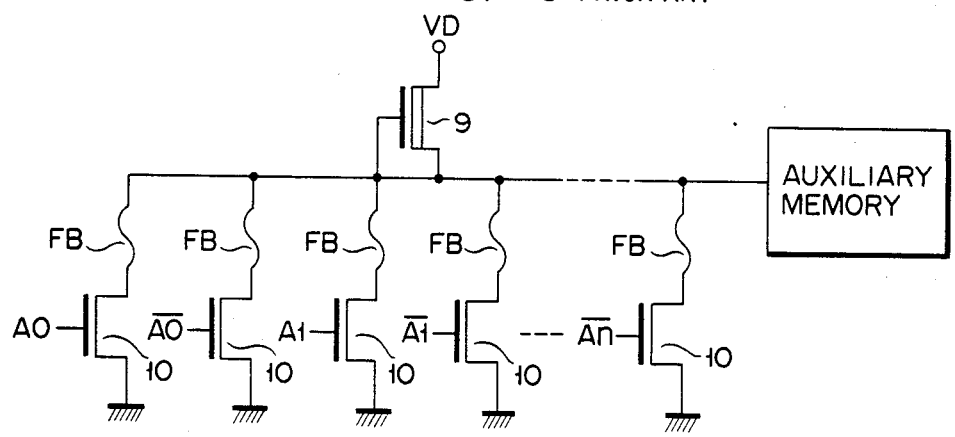
FIG. 3 shows a practical arrangement of a conventional decoder circuit for an auxiliary memory.
Figure 6:
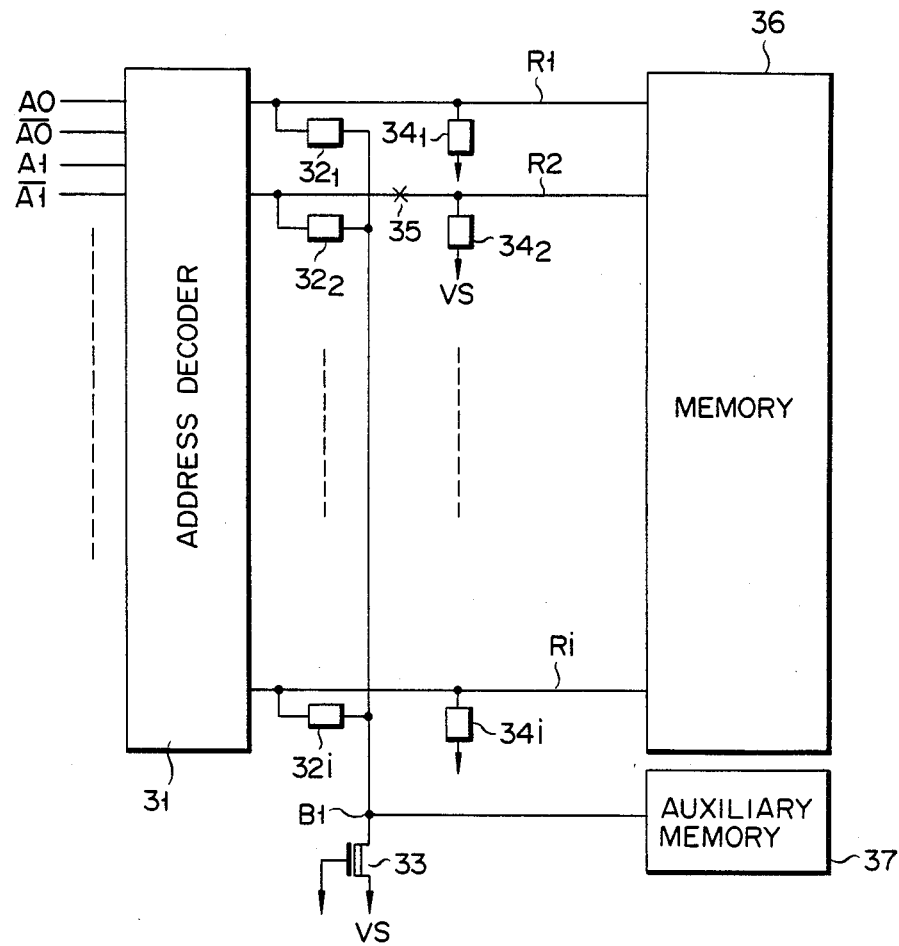
FIG. 6 shows a block diagram of an embodiment of a semiconductor memory device containing an auxiliary memory according to the present invention.

Preferred embodiments of the present invention will be described referring to the accompanying drawings. In FIG. 6, reference numeral 31 designates an address decoder which receives an address signal A0, $\overline{A0}$, ..., An, $\overline{An}$ and selects one of the output lines R1 to Ri, which is specified by the address signal. The output lines R1 to Ri are connected to a drain terminal B1 of a depletion type MOS transistor 33 via high resistance polysilicon $32_1$ to $32_i$, and also coupled with a main memory, as in the prior art. The drain terminal B1 of the transistor 33 is connected to an auxiliary memory 37 and its gate and source terminals are connected to a power source VS (ground). The output lines R1 to Ri are connected through high resistance polysilicon $34_1$ to $34i$ to the power source VS. In FIG. 6, when no error bit cell is contained in the main memory 36, this memory is selected. At this time, the auxiliary memory 37 is not selected because point B1 is connected through the transistor 33 to the terminal VS. If an error bit cell is found in the memory cells connected to the output line R2, the output line R2 is cut at a point 35 by means of a laser beam, for example, to separate the decoder 31 from the main memory 36. The cut output line R2 is coupled with the VS potential through the high resistance polysilicon $34_2$. Therefore, this output line R2 is not selected in the subsequent stage. In this case, if the high resistance polysilicon $34_2$ is annealed by irradiation of a laser beam to reduce its resistance, the output line R2 can be reliably connected to the VS terminal. After the output line R2 is separated from the decoder 31, the high resistance polysilicon $32_2$ is subjected to the laser annealing process to reduce its resistance so as to be connected to point B1. Accordingly, when an address signal for selecting the output line R2 is applied to the address decoder 31, the point B1 is selected through the high resistance polysilicon $32_2$ (with the now reduced resistance) and selects the auxiliary memory 37.

Figure 7:
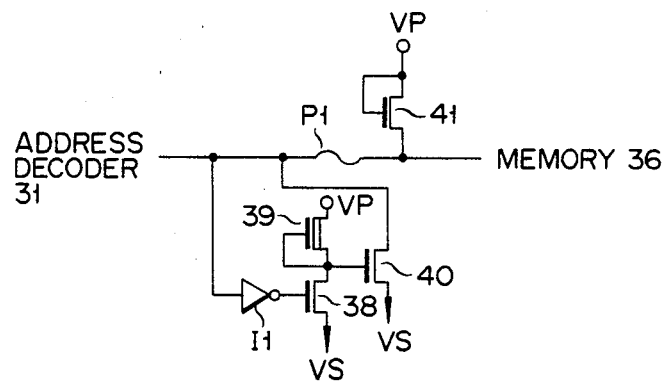
FIG. 7 shows another example of a burning circuit used in the memory device of FIG. 6.

Turning now to FIG. 7, a cut-off circuit is shown which cuts off the output line R2 at the point 35 by current flowing therethrough, not by the laser beam as mentioned above. In the present embodiment, the cut-off point 35 is made of a polysilicon fuse P1 provided between the decoder 31 and the main memory 36. In order to melt the high resistance polysilicon fuse P1, an address signal to select an error bit cell is input to the decoder 31 which in turn produces an output signal "1". Then, the output of the inverter I1 is logical "0" and the transistor 38 is cut off. At this time, a high voltage VP is applied to the transistor 40 through the depletion type MOS transistor 39. Current flows from the high voltage source VP through the transistor 41, the fuse P1, and the transistor 40 to heat and melt the fuse P1. In this instance, the high voltage source VP is used for melting the fuse P1. This high voltage source VP is used in order to cause a large current to flow through the transistors 40 and 41 even if the transistors 40 and 41 are of small size. Therefore, if the transistors 40 and 41 are both large, an ordinary power source may be used in place of the high voltage power source VP. While the present instance employs a single auxiliary memory, the same thing is applied for the case using two auxiliary memories. In this case, another set of high resistance polysilicons $32_1$ to $32i$, $34_1$ to $34i$ and the transistor 33 must be used.

In the embodiments shown in FIGS. 6 and 7, when the main memory contains an error bit cell, the interconnection between the decoder and the main memory is cut off at a single point and the high resistance polysilicon connected between the decoder and the auxiliary memory is subjected to laser annealing to reduce its resistance. In this way, the bit cells containing an error bit cell arrayed on a specific output line of a main address decoder in the main memory are replaced with those in the auxiliary memory. In this way, the main memory containing an error bit cell can be saved.

Figure 8:
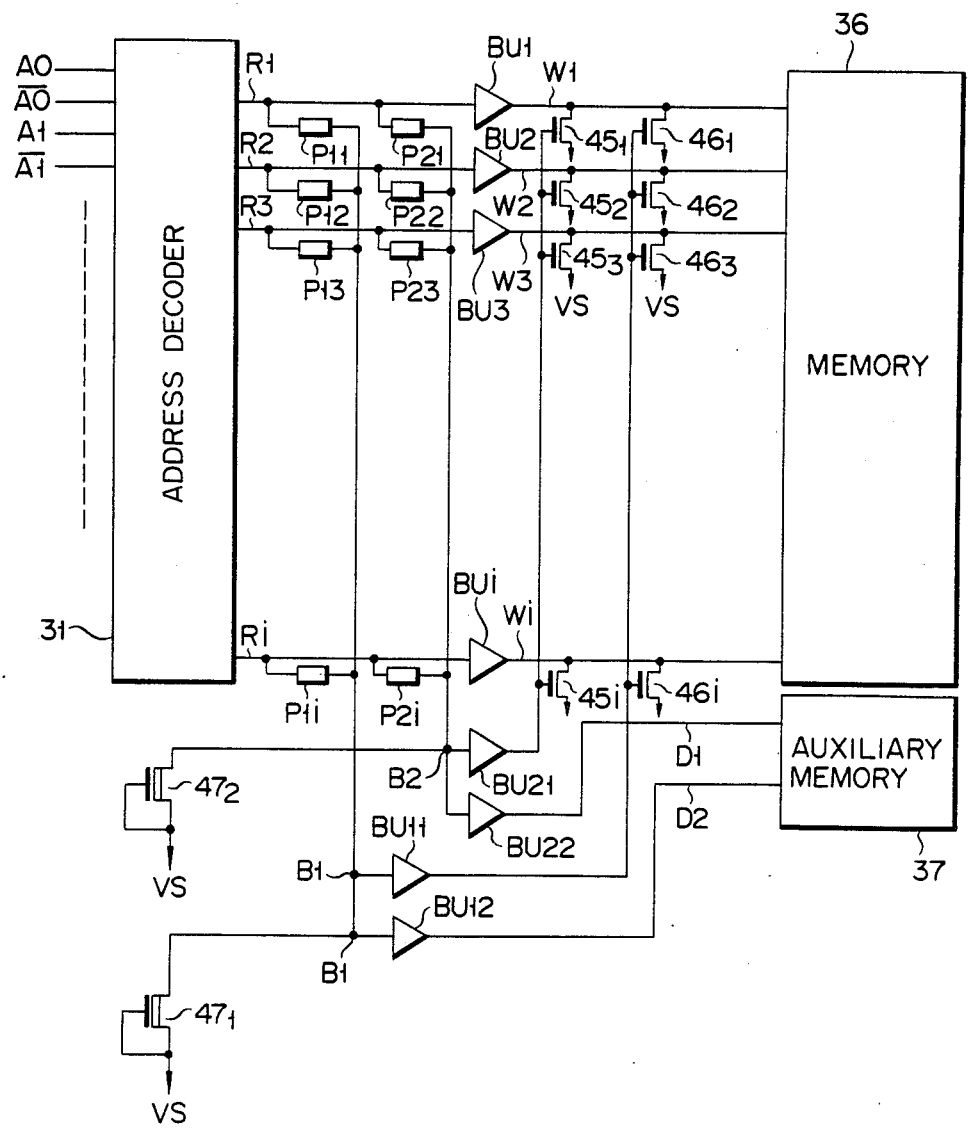
FIG. 8 shows a block diagram of another embodiment of a semiconductor device according to the present invention.
Figure 9A:
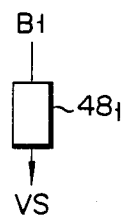
FIGS. 9A and 9B show high resistance polysilicon resistors for controlling signal levels at points B1 and B2 in the memory device of FIG. 8.
Figure 9B:
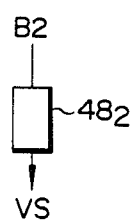

Turning now to FIG. 8, another embodiment of a semiconductor memory device containing an auxiliary memory is shown. In FIG. 8, like reference symbols are used to designate like or equivalent portions in FIG. 6.

In the present embodiment, output lines R1 to Ri of a decoder 31 are coupled with input terminals of buffer circuits BU1 to BUi, respectively. The output terminals of the buffer circuits BU1 to BUi are connected to a main memory 36 through drive lines W1 to Wi. The output lines R1 to Ri are commonly connected to the input terminals of buffers BU11 and BU12, through high resistance polysilicons P11 to P1i. The output lines R1 to Ri are also commonly connected to the input terminals of buffers BU21 and BU22, through high resistance polysilicons P21 to P2i. The drive lines W1 to Wi are connected to a power source VS (ground), through enhancement type MOS transistors (N channel) $45_1$ to $45i$, and are also connected to the power source VS through transistors $46_1$ to $46i$. The gates of the transistors $45_1$ to $45i$ are commonly connected to the output terminal of the buffer circuit BU21. The gates of the transistors $46_1$ to $46i$ are commonly connected to the output terminal of the buffer circuit BU11. The output terminal of the buffer circuit BU22 is connected to a drive line D1 of the auxiliary memory 37, and the output terminal of the buffer circuit BU12 is connected to a drive line D2 of the auxiliary memory 37. The input terminals B1 of the buffer circuits BU11 and BU12 are connected to the drain terminals of the depletion type MOS transistor $47_1$ and the input terminals B2 of the buffer circuits BU21 and BU22 are connected to the drain terminal of the transistor $47_2$.

In operation, when an error bit cell is not contained in the main memory 36, the decoder 31 selects one of the output lines R1 to Ri according to an address signal A0, $\overline{A0}, \ldots,$ An, $\overline{An}$, and sets the selected one at logical "1". This logical "1" signal is applied to the buffer circuit associated with the selected output line and then rapidly charges one of the drive lines W1 to Wi to set it at logical "1". The points B1 and B2 are set at the VS level (ground) through the transistors $47_1$ and $47_2$, and hence the points B1 and B2 are kept at the VS level. Therefore, the drive lines D1 and D2 connected through the buffer circuits BU11 and BU12 to the points B1 and B2 and the gates of the transistors $45_1$ to $45i$ and $46_1$ to $46i$ connected to the points B1 and B2 through the buffer circuits BU12 and BU22, are kept at logical "0". Then, one of the drive lines connected to the main memory 36 is selected.

It is assumed that one of the memory cells connected to the drive line W3, for example, is an error bit cell. In this case, the high resistance polysilicon P13 is annealed by laser beam, for example, thereby reducing its impedance or resistance. As a result, the output line R3 and the point B1 are electrically connected to each other. When the decoder 31 renders the output line R3 at logical "1", the point B1 is also logical "1". Incidentally, the transistor $47_1$ has a high enough resistance to have no influence on the logical "1" of the output line R3. As a result, the transistors $46_1$ to $46i$ are turned on and the drive lines W1 to Wi are "0". The bit cells of the auxiliary memory connected to the drive line are selected through the drive line D2. In this way, the desired memory cells of the auxiliary memory may be selected by merely laser-annealing one high resistance polysilicon P3.

If an error bit cell is found on a drive line other than the drive line W3, all one has to do is to reduce the resistance of one of the high resistance polysilicons P21 to P2i, which corresponds to the drive line connected to the additional error bit cell. While the auxiliary memory has two drive lines in FIG. 8, the drive lines may be increased to any number, if necessary.

In the memory device of FIG. 8, the MOS transistors $47_1$ and $47_2$ may be replaced with high resistance polysilicons $48_1$ and $48_2$ which are both connected at one end to the points B1 and B2, and at the other end to the VS power source. In this case, if the auxiliary memory is not used, the high resistance polysilicons are annealed to reduce their resistance, and the potential at the points B1 and B2 is at the VS level (logical "0").

These transistors $47_1$ and $47_2$ and the high resistance polysilicon $48_1$ and $48_2$ are not always needed. In the integrated circuit, if PN junctions are formed in their place, the points B1 and B2 are always kept at "0" level by the leak current of the PN junction or the like. In this case, the potential at the points B1 and B2 may be reliably kept at logical "0".

Figure 10:
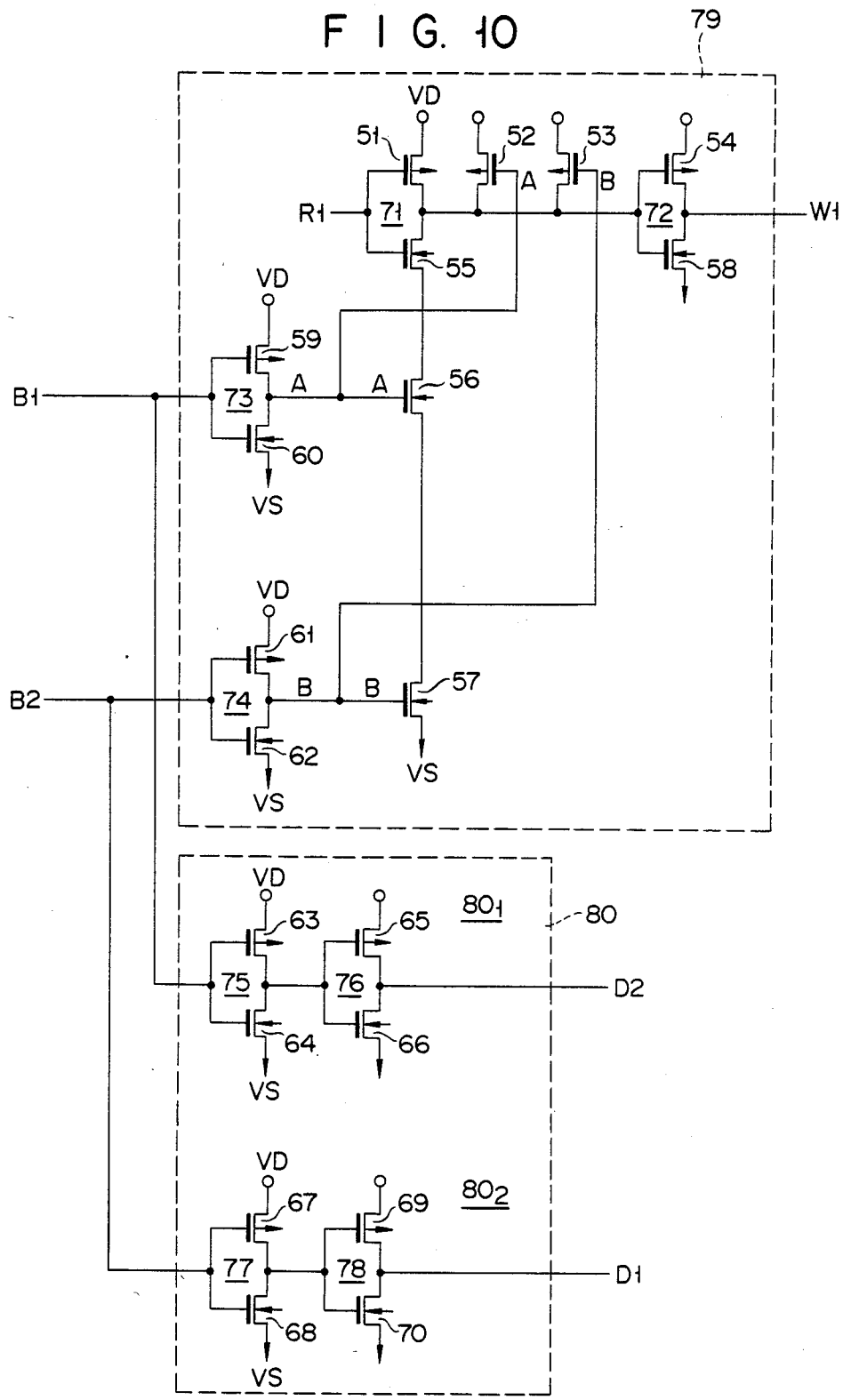
FIG. 10 shows a practical arrangement of main and auxiliary address decoders for selecting main and auxiliary memories, respectively.

FIG. 10 shows a circuit diagram of the buffers BU11, and BU22 and BU12 in FIG. 8. In FIG. 10, reference numeral 79 designates a main address buffer and 80 an auxiliary address buffer containing buffer sections $80_1$ and $80_2$ which correspond to the buffers BU22 and BU12. In FIG. 10, MOS transistors 51 to 54, 59, 61, 63, 65, 67 and 69 are P channel MOS transistors, and transistors 55 to 58, 60, 62, 64, 66, 68 and 70 are N channel MOS transistors. The transistors 52 and 56 functionally correspond to transistors $46_1$ to $46i$, and similarly, the transistors 53 and 57 correspond to the transistors $45_1$ to $45i$. The pairs of transistors 51 and 55, 54 and 58, 59 and 60, 61 and 62, 63 and 64, 65 and 66, 67 and 68, and 69 and 70 make up CMOS inverters 71 to 78, respectively. The input terminals of the inverters 73 and 74 are connected to the points B1 and B2 of the memory device of FIG. 8. The output signal of the inverter 73 is applied to the gates of the transistors 56 and 52, and the output signal from the inverter 74 is connected to the gates of the transistors 57 and 53.

When no error bit cell is found in the main memory coupled with the buffer circuits thus arranged, the signal level at the points B1 and B2 is "0". Accordingly, the output signals of the inverters 65 and 66 are both logical "1", so that the transistors 56 and 57 are both ON and the transistors 52 and 53 are both OFF. The output line R1 and the drive line W1 are both at the same level. In this manner, the drive line W1 is selected.

Let us consider that an error bit cell is connected to the drive line W1, for example. The signal at point B1 is logical "1" and the output A of the inverter 73 is logical "0". Accordingly, the transistor 56 is turned off and the transistor 52 is turned on. Therefore, the drive line W1 is logical "0" and the main memory 36 is not selected. At this time, the point B1 is logical "1". The output of the buffer section $80_1$ connected to the drive line D2 in the auxiliary buffer 80 is logical "1" to select the drive line D2 of the auxiliary memory 37. In other words, the bit cells on the drive line W1 containing an error bit cell are replaced with the bit cells on the drive line D2 of the auxiliary memory 37.

Figure 11:
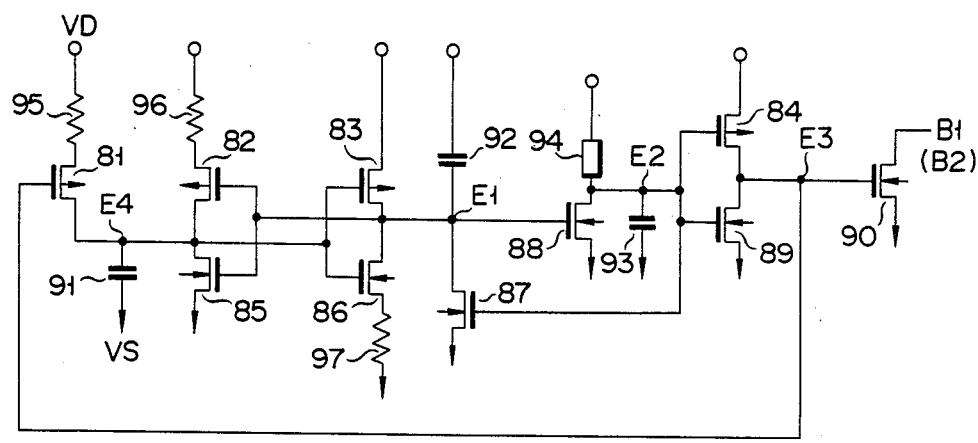
FIG. 11 is a CMOS circuit arrangement for controlling signal levels at points B1 and B2 in the memory device of FIG. 8.

FIG. 11 shows a CMOS circuit used in place of the MOS transistor $47_1$ or $47_2$ in FIG. 8. This circuit is comprised of MOS transistors 81 to 90, capacitors 91 to 93, a high resistance polysilicon 94, and resistors 95 to 97. The transistors 81 to 84 are of the P channel type, while the transistors 85 to 90 are of the N channel type. The transistor 81 is connected at the source to a power source VD through a resistor, and at the drain to the power source VS through the capacitor 91. The transistors 82 and 85 form a CMOS inverter. The source of the transistor 82 is connected to the power source VD, via the resistor 96. The source of the transistor 85 is connected to the potential VS. The transistors 82 and 85 are interconnected at the drain and their junction is connected to the drain of the transistor 81. The transistors 83 and 86 constitute a CMOS inverter. The source of the transistor 86 is connected to the ground potential VS via the resistor 97. The gates of the transistors 83 and 86 are interconnected and their junction is connected to the drain of the transistor 81. The drains of the transistors 83 and 86 are interconnected and their junction is connected to the gate of the transistors 82 and 85. The drain of the transistor 87 is connected to the power source VD via the capacitor 92, and its source is connected to the ground potential VS. The drain of the transistor 87 is connected to a drain junction between the transistors 83 and 86. The transistor 88 is connected to the power source VD via the high resistance polysilicon 94, and its source is connected to the ground potential VS. The gate of the transistor 88 is connected to the drain interjunction between the transistors 83 and 86. A capacitor 93 is connected between the junction of the transistor 88 and the polysilicon 94, and the ground potential VS. The transistors 84 and 89 form a CMOS inverter. The source of the transistor 84 is connected to the power source VD and the source of the transistor 89 is connected to the ground potential VS. The gates of the transistors 84 and 89 are connected to the gate of the transistor 87 and the drain of the transistor 88. The transistors 84 and 89 are interconnected at the drains and their junction is connected to the gate of the transistor 81. The drain of the transistor 90 is connected to the point B1 or B2 in the memory device of FIG. 8, and its source is connected to the ground potential VS. The gate of the transistor 90 is connected to the drain interjunction of the transistors 84 and 89. In the operation of this circuit, when the power source VD is turned on, the potential at point E1 becomes high (logical "1"). At this time, the point E2 is logical "0" since the high resistance polysilicon 94 is present. The point E3 is logical "1" and the points B1 and B2 are kept at VS level. When the main memory contains an error bit cell, the high resistance polysilicon 94 is laser-annealed to reduce its resistance. Therefore, the power source VD is turned on, the points E1 and E2 are at VD level and the point E3 is at VS level. Since the point E1 is at VD level, the transistor 88 is turned on. If a resistance ratio of the resistance reduced polysilicon 94 and the transistor 88 is set at a proper value, the point E2 is kept at logical "1". Since the point E3 is "0", the transistors 81 and 87 are both turned on and the potential levels at the points E4 and E1 are inverted to "1" and "0", respectively. Therefore, the transistor 88 is turned off and the point E2 is logical "1" and the point E3 is logical "0". As a result, the transistor 90 is turned off. Therefore, the points B1 and B2 are both logical "1" at the time when it receives an address signal to select an error bit cell.

Figure 12:
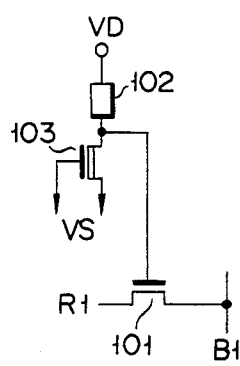
FIGS. 12 and 13 show practical arrangements of a circuit for connecting a row line with a drive line.
Figure 13:
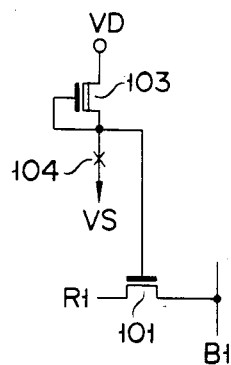

FIGS. 12 and 13 show other means for selecting a specific drive line of the auxiliary memory which correspond to the high resistance polysilicons P11 to P1$i$ and P21 to P2$i$ in the memory device shown in FIG. 8. The embodiment shown in FIG. 12 employs a MOS transistor 101 in place of the polysilicons in FIG. 8. This circuit is further provided with a high resistance polysilicon 102 connected between the gate of the transistor 101 and the power source VD, and a depletion type MOS transistor 103 connected between the polysilicon 102 and the ground potential VS. When an error bit cell is contained in the main memory, the polysilicon 102 is subjected to laser annealing, for example, to reduce its resistance. With this reduction of resistance, the transistor 101 is turned on to change its impedance, and the output line R1 and the point B1 are connected to each other. Finally, the auxiliary memory is selected.

In the embodiment of FIG. 13, like that of FIG. 12, a MOS transistor 101 is used in place of the high resistance polysilicons P11 to P1$i$ and P21 to P2$i$. In this example, the MOS transistor 103 is connected at the drain to the power source VD and at the gate and the source to the ground potential VS. The gate of the transistor 101 is connected to the gate and source of the transistor 103. When an error bit cell is present in the main memory, a laser beam is applied to a melting location on the interconnection wire between the junction of the gate and source of the transistor 103 and the ground, thereby cutting off the wire. As the result, the transistor 101 is turned on to select the drive line of the specific bit cells in the auxiliary memory.

Figure 14:
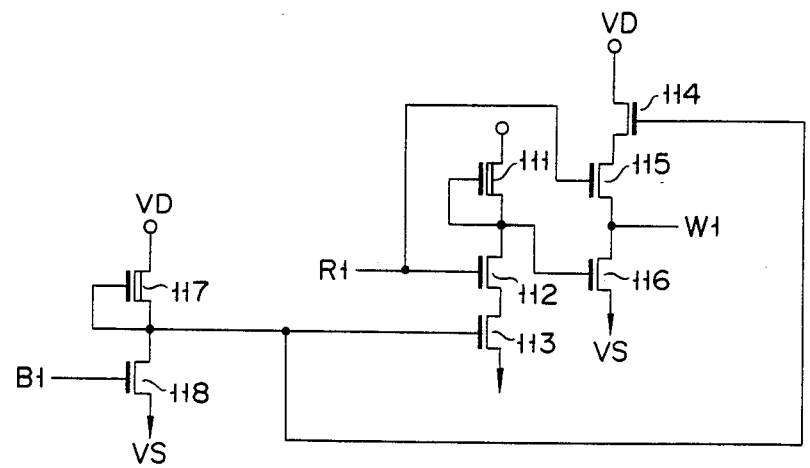
FIG. 14 is a practical arrangement of a buffer used in the memory device shown in FIG. 8.

FIG. 14 shows a circuit arrangement formed when each of the buffers BU1 to BU$i$ in the memory device of FIG. 8 is constructed using N channel E and D (enhancement and depletion) type MOS transistors. The gate of an E type MOS transistor 112 is connected to the row line R1, and its drain is connected to the power source VD through a D type MOS transistor 111. The source of the transistor 112 is connected to the potential VS through an E type MOS transistor 113. The row line R1 is connected to the gate of the E type MOS transistor 115 and its drain is connected to the power source VD through an E type transistor 114. Its source is connected to the ground potential VS through the E type transistor 116. A junction between the transistors 115 and 116 is connected to the drive line W1 of the main memory. The D type transistor 117 and the E type MOS transistor 118 make up an E/D type inverter. The gate of the transistor 118 forms an input terminal of the inverter which is connected to the point B1 in the memory device of FIG. 8. A junction of the transistors 117 and 118 forms an output terminal of the inverter which is connected to the gates of the transistors 113 and 114.

In the memory device shown in FIG. 8, when no error bit cell is present in the main memory 36, the output line R1 is selected and becomes logical "1", the point B1 being logical "0". When the output line R1 is logical "1", the transistors 112 and 115 are turned on. When the point B1 is logical "0", the inverter comprised of the transistors 117 and 118 is logical "1". Therefore, the transistors 113 and 114 are turned on. When the transistors 112 and 113 are both turned on, the gate of the transistor 116 becomes logical "0" and is thus turned off. In this way, the transistors 114 and 115 are both turned on and the transistor 116 is turned off, so that the drive line W1 is logical "1" and is selected. In this way, the main memory is accessed.

When an error bit cell is present in the main memory, the output line R1 is logical "1" and the point B1 is logical "1". Therefore, the transistors 115 and 116 are both turned on, while the transistors 113 and 114 are both turned off. The transistors 111 and 112 are both turned on, and the transistor 113 is turned off, so that the gate of the transistor 116 is logical "1" and is turned on. In this way, the transistor 114 is turned off and the transistors 115 and 116 are turned on. The drive line is logical "0", and therefore is not selected. In this case, the drive line connecting to specific memory cells in the auxiliary memory is selected. When the buffer arranged as shown in FIG. 14 is applied for the buffers BU1 to BU$i$, the transistors $45_1$ to $45_i$ in the memory device of FIG. 8 are not required.

Figure 15:
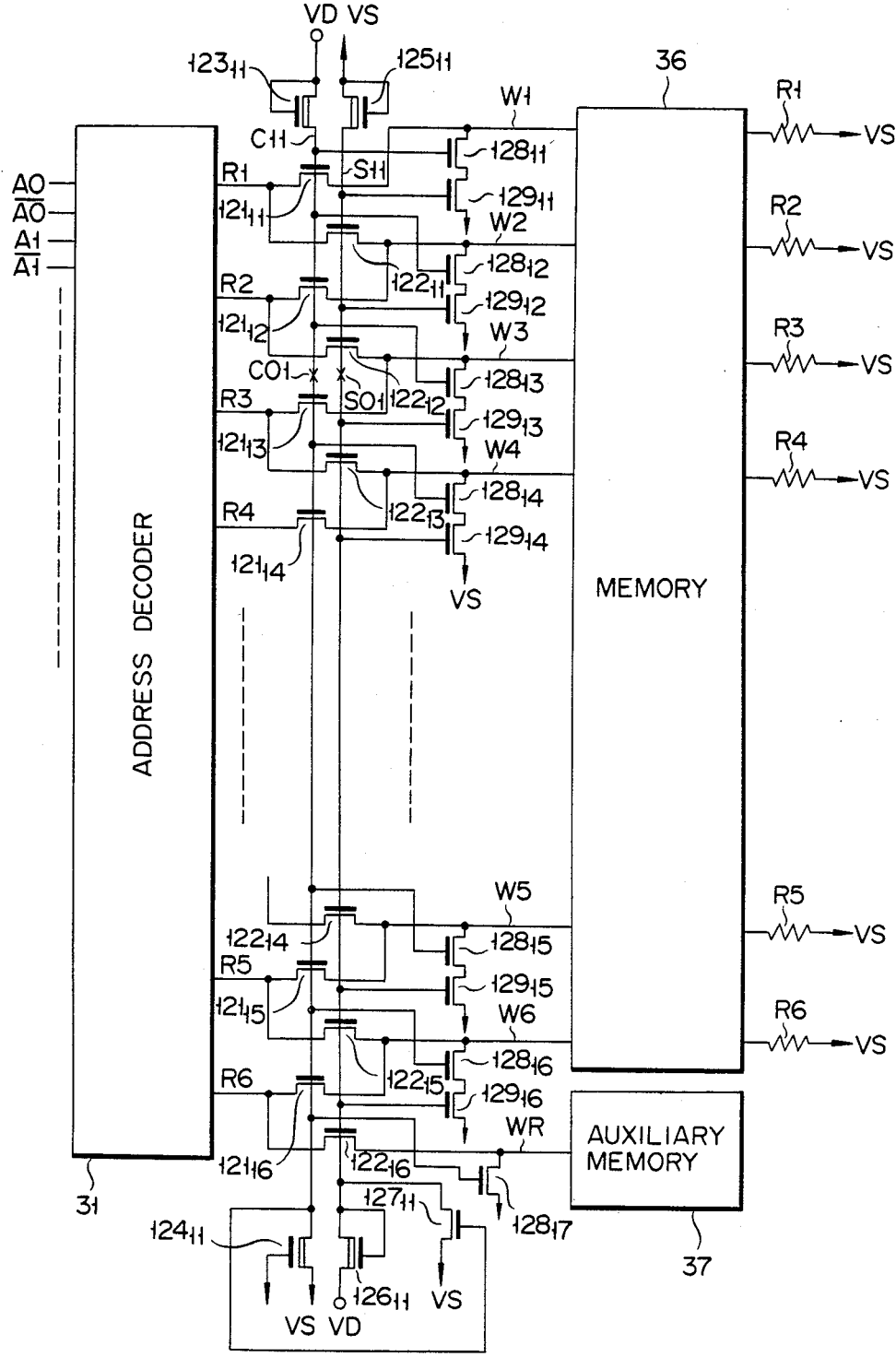
FIG. 15 shows a block and circuit diagram of another embodiment of a semiconductor memory device according to the present invention.

FIG. 15 shows another embodiment of the present invention. In the figure, like reference symbols are used for designating like or equivalent portions in FIG. 8. The output line R1 is branched into two routes. One of the two routes is connected to the main memory through an enhancement type MOS transistor $121_{11}$, while the other is connected to the main memory cell 36 through an enhancement type MOS transistor $122_{11}$ and a drive line W2. The same thing is true for the output lines R2 to R5. The output line R6 is branched into two routes. One of the routes is connected to the main memory 36 through an enhancement type MOS transistor $121_{16}$ and a drive line W6, while the other is connected to an auxiliary memory 37 through an enhancement type MOS transistor $122_{16}$ and the drive line WR. One end of the gate drive line C11 for the transistors $121_{11}$ to $121_{16}$ is connected to the power source VD through a depletion type MOS transitor $123_{11}$. The other end of the gate drive line is connected to the VS potential terminal (ground) of a depletion type MOS transistor $124_{11}$. A gate drive line S11 for the transistors $122_{11}$ to $122_{16}$ is connected to the VS potential terminal through a depletion type MOS transistor $125_{11}$, while the other end is connected to the power source VD through a depletion type MOS transistor $126_{11}$. A drive line S11 is connected to the VS potential terminal through an enhancement type MOS transistor $127_{11}$, and the gate of the transistor $127_{11}$ is connected to a drive line C11. A drive line W1 is connected to the VS potential terminal through enhancement type MOS transistors $128_{11}$ and $129_{11}$. The same thing is correspondingly applied for the remaining drive lines W2 to W6. The gates of the transistors $128_{11}$ to $128_{16}$ are connected to an interconnection wire C11 and the gates of transistors $129_1$ to $129_6$ are connected to the interconnection wire S11. A drive line WR is connected to the VS potential through a transistor $128_{17}$, and the gate of the transistor $128_{17}$ is connected to the interconnection wire C11.

In the circuit shown in FIG. 15, the conduction resistance of the depletion type MOS transistor $124_{11}$ is much larger than that of the depletion type MOS transistor $123_{11}$. As a result, the interconnection wire C11 is kept at the level of the power source VD (5 V). For this reason, the transistors $121_{11}$ to $121_{16}$ are turned on. Meanwhile, the transistor $127_{11}$ connected at the gate to the interconnection wire C11 is turned on, the wire S11 is at approximately VS potential (0 V), and the transistors $122_{11}$ and $122_{16}$ are both in an OFF state. The interconnection wire WR leading to the auxiliary memory 37 connected to the transistor $122_{16}$ is at VS potential level via the transistor $128_{17}$, and the auxiliary memory 37 is in a nonselect state. In this case, the following connections are performed.

the output line R1 is connected to the drive line W1,
the output line R2 is connected to the drive line W2,
the output line R3 is connected to the drive line W3,
.
.
.
the output line R6 is connected to the drive line W6.

In this condition, the memory 36 is tested. It is assumed that in this test, no error bit cell is found in the memory bit cells connected to the drive line W3, for example, of the main memory. In this case, the interconnection wire C11 is cut off at a point C01 between the junction of the gate of transistor $121_{12}$ and the gate of transistor $128_{13}$, and the gate of transistor $121_{13}$. The wire S11 is cut off by the laser beam, for example, at a point S01 between the gate of the transistor $122_{12}$ and a junction between the gates of the transistors $129_{13}$ and $122_{13}$. As the result of cutting off the wire C11 at the point C01, the potential of the wire C11 between the transistor 123 and the point C01 is equal to that of the power source VD. The potential of the wire between the point C01 and the transistor $124_{11}$ is at the potential of VS since the transistor $124_{11}$ is discharged. For this reason, the transistors $121_{13}$ to $121_{16}$ are turned off. The potential of the wire S11 between the transistor $125_{11}$ and the point S01 is kept at the VS potential. The wire between the point S01 and the transistor $126_{11}$ is charged by the transistor $126_{11}$ since the transistor $127_{11}$ is turned off, and therefore it is at the power source VD level. Accordingly, the transistors $122_{13}$ to $122_{16}$ are turned on. Thus, when the interconnection wires are cut off at the points C01 and S01, the transistors $121_{11}$, $121_{12}$, and $122_{13}$ to $122_{16}$ are turned on. Then, the output line R1 is connected to the drive line W1, the output line R2 is connected to the drive line W2, the output line R3 is connected to the drive line W4, the output line R5 is connected to the drive line W6, the output line R6 is connected to the drive line WR.

As seen from the above, the drive lines W4 to W5 located below the cutting points C01 and S01, as viewed in FIG. 15, are switched so as to be selected by the different address data in succession. The output line R6 is connected to the drive line WR so as to finally select the drive line containing specific memory bit cells in the auxiliary memory. The drive line W3 having the error bit cell is always kept at the VS potential since the transistors $128_{13}$ and $129_{13}$ are both kept on. Therefore, the drive line W3 is never selected.

In FIG. 15, resistors with high resistance R are connected to the drive lines W1 to WR to couple the drive lines W1 to WR with the VS potential. With this connection, when none of the drive lines W1 to WR contain an error bit cell and any one of these drive lines is selected, it is logical "1"; when it contains an error bit cell, it is logical "0". Therefore, if high resistors R are connected to the drive lines, the transistors $128_{11}$ to $128_{16}$ and $129_{11}$ to $129_{16}$ are unnecessary.

As described above, in the embodiment of FIG. 15, when the main memory contains an error bit cell, it may be switched to the auxiliary memory simply by cutting two locations of the interconnection wires, irrespective of the number of bits of the address signal.

Figure 16:
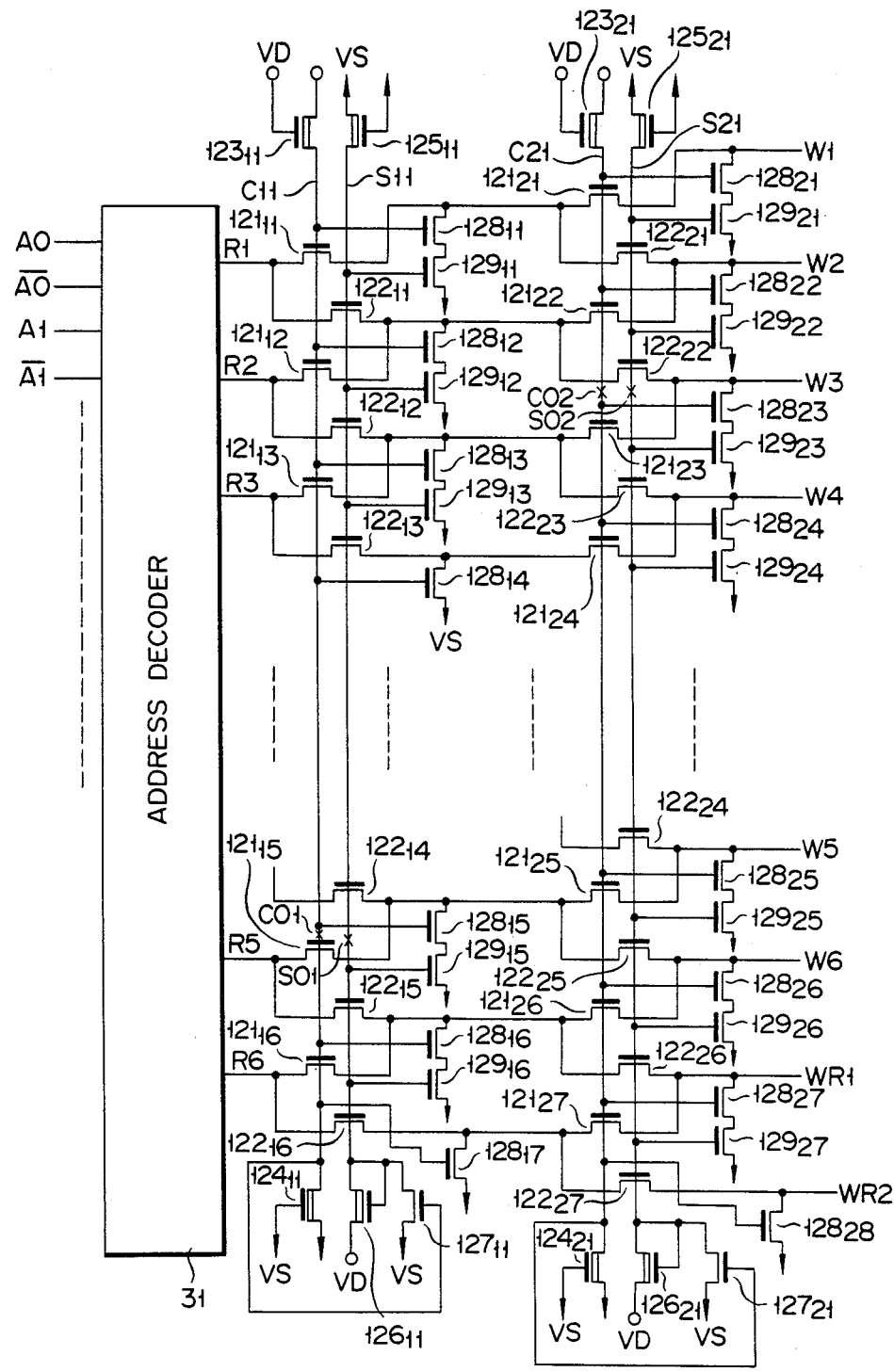

The embodiment of FIG. 15 uses only one drive line WR and is connected to the auxiliary memory 37 in preparation for a single error bit cell. An embodiment shown in FIG. 16 uses two drive lines WR in order to handle two error bit cells. In FIG. 16, another switch circuit for switching an access mode of the memory device from the main memory to the auxiliary memory is used in addition to that in the embodiment of FIG. 15. These switch circuits have substantially the same arrangements. Therefore, no further explanation of these switch circuits will be given, and similar reference numerals will be applied to similar portions.

In the FIG. 16 embodiment, as in the FIG. 15 embodiment, when the power source is turned on, the transistors $121_{11}$ to $121_{16}$ and $121_{21}$ to $121_{27}$ are turned on and the transistors $122_{11}$ to $122_{16}$ and $122_{21}$ to $122_{27}$ are turned off. Therefore,
the output line R1 is connected to the drive line W1,
the output line R2 is connected to the drive line W2,
the output line R6 is connected to the drive line W6.

The drive lines WR1 to WR2 for the auxiliary memory 37 are logical "0" (VS level) since the transistors $128_{17}$ and $128_{28}$ are turned on. In this condition, the main memory 36 is tested. If the drive lines W3 and W4 contain error bit cells, points C02 and S02 on the interconnection wires C21 and S21 are first cut off. Then,
the output line R1 is connected to the drive line W1,
the output line R2 is connected to the drive line W2,
the output line R3 is connected to the drive line W4,
the output line R5 is connected to the drive line W6,
the output line R6 is connected to the drive line WR1.
In the next step, the points C01 and S01 of the interconnection wires C11 and S11 are cut off. Then,
the output line R1 is connected to the drive line W1,
the output line R2 is connected to the drive line W2,
the output line R3 is connected to the drive line W4,
the output line R5 is connected to the drive line WR1,
the output line R6 is connected to the drive line WR2.
As just mentioned, the drive lines W3 and W5 containing the error bit cells are not selected, but the drive lines located below them, as viewed in FIG. 16 are selected.

As described above, if two memory areas are provided in the auxiliary memory, the main memory having two error bit cells may be saved by cutting off only four locations of the interconnection wires.

Figure 17:
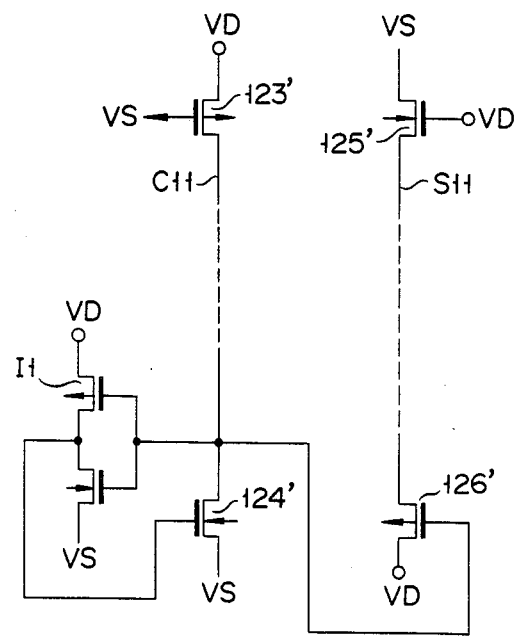
FIGS. 16 and 17 show circuit diagrams of other embodiments of the present invention.

FIG. 17 shows a circuit arrangement of a memory device when the FIG. 15 memory device is constructed using complementary MOS transistors. In the figure, the transistors 123' to 126' correspond to the transistors 123 to 126, respectively. In the circuit shown in FIG. 17, current consumption in a stationary state in zero because the circuit is MOS-configured. If no error bit cell is contained in the main memory, the interconnection wire C11 is logical "1" and the output of the inverter I1 is logical "0". The transistor 124' is turned off and the interconnection wire C11 is logical "1" (VD level). Further, since the transistor 126' is turned off, the wire S11 is logical "0" (VS potential). When an error bit cell is contained, the wires C11 and S11 are cut off at proper positions thereof. When the power source is turned on in this state, the drain of the transistor 124' remains logical "0" since the wire C11 has been cut off. At this time, the output of the inverter I1 is "1", the transistor 124' is turned on, and the drain of the transistor 124' is stable at logical "0". Since the gate of the transistor 126' is logical "0", the transistor 126' is turned on and the drain of the transistor 126' becomes logical "1", because the wire S11 is cut off at its proper location.

If the gates of the transistors $121_{11}$ to $121_{16}$, which were set at the VD level, are set above the VD level, and these transistors are operated in a triode mode, the output levels of the drive lines W1 to W6 may be raised to the VD level. In this case, the transmission characteristics of the transistors are improved.

As described above, the number of interconnection wires to be cut off for selecting the specific memory bit cells in the auxiliary memory may be reduced when compared to that of the prior art.

Figure 18:
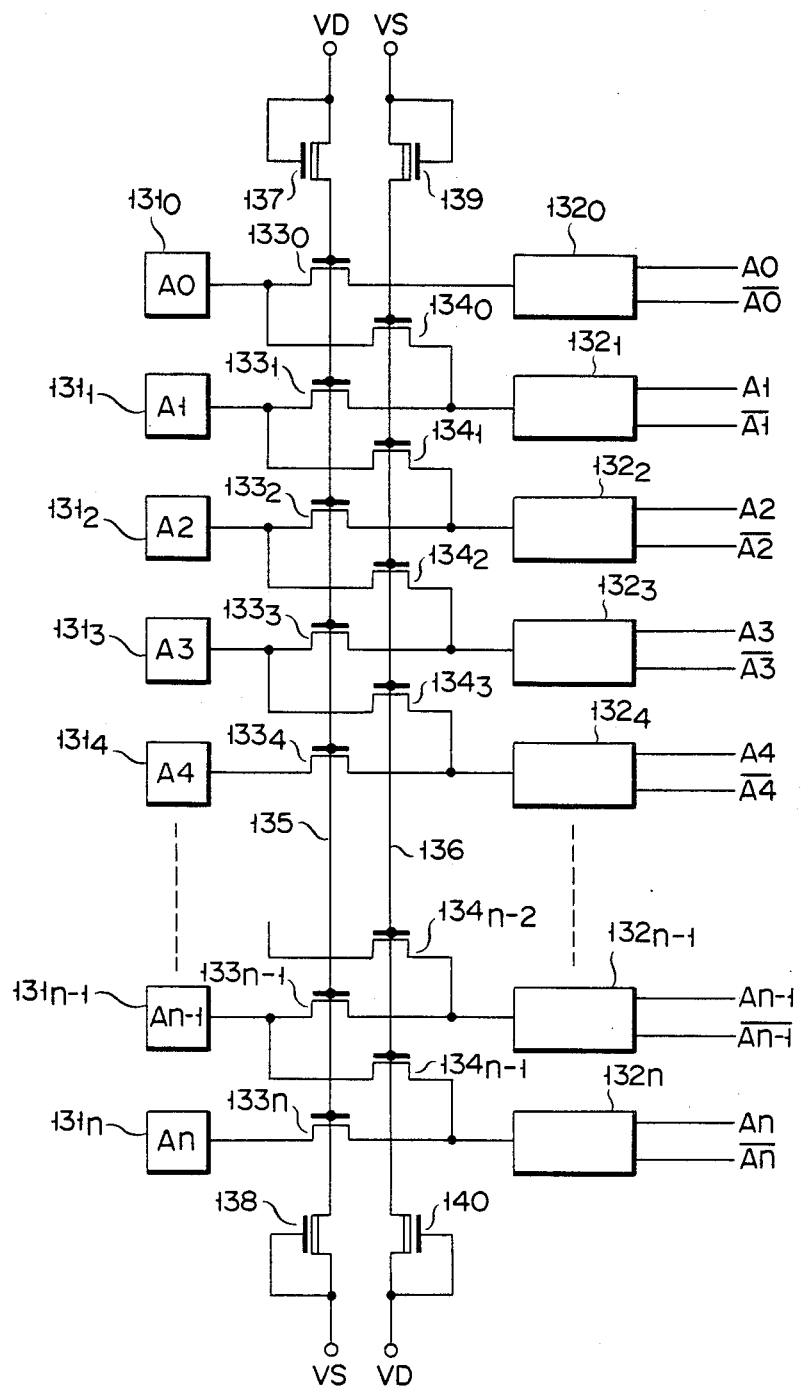
FIG. 18 shows a circuit diagram of another embodiment of the present invention.

Turning to FIG. 18, another embodiment of the present invention is shown. In the figure, reference numerals $131_0$ to $131_n$ designate address input terminals (referred to as pins) supplied with input address signal or data A0 to An. Address buffers $132_0$ to $132_n$ are provided corresponding to these pins $131_0$ to $131_n$, and produce pairs of address data A0, $\overline{A0}$ to An, $\overline{An}$ which are complements of the input address data. Inserted between the pins $131_0$ to $131_n$ and the address buffers $132_0$ to $132_n$ are drain-source paths of enhancement type MOSFEs $133_0$ to $133_n$, respectively. Similarly, the drain-source paths of enhancement type MOSFETs $134_0$ to $134_{n-1}$ are inserted between the pins $131_0$ to $131_{n-1}$ and the address buffers $132_1$ to $132_n$ which are one bit higher than the pins. In connection with the address data A0 to An, the A0 designates the least significant bit and the An the most significant bit. The gate of the MOSFETs $133_0$ to $133_n$ and $134_0$ to $134_{n-1}$ are commonly connected by interconnection wires 135 and 136, respectively, as shown. One end of the wire 135 is connected to a point impressed with a positive power source voltage VD through a depletion type MOSFET 137. The gate of the MOSFET 137 is coupled with the VD impression point. The other end of the wire 135 is connected to a point impressed with a reference power source voltage VS through a depletion type MOSFET 138. The gate of MOSFET 138 is connected to the VS impression point. The size of the MOSFETs 137 and 138 are both such that the level of the wire 135 is logical "1". One end of the wire 16 is connected to the VS impression point by way of a depletion type MOSFET 139. The gate of the MOSFET 139 is connected to the VS impression point. The other end of the wire 136 is connected to the VD impression point by way of a depletion type MOSFET 140 whose gate is connected to the VD impression point. The sizes of the MOSFETs 139 and 140 are such that the level of the wire 136 is logical "0".

Figure 19:
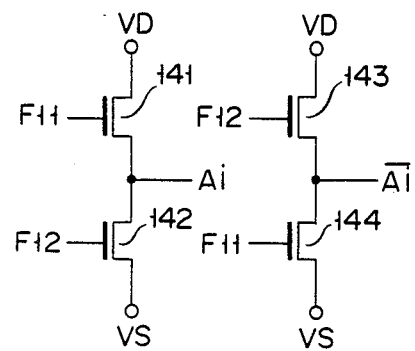
FIG. 19 shows a circuit diagram of an example of an address signal fixing circuit included in the embodiment of FIG. 18.

FIG. 19 shows a circuit arrangement of an address data fixing circuit (not shown) provided at an address data output terminal of each of the address buffers $132_0$ to $132_n$. The address data fixing circuit fixes the output data Ai and $\overline{Ai}$ thereof according to control signals F11 and F12, irrespective of the contents of the address data input to the input terminals of the address buffers $132_0$ to $132_n$. This circuit is made up of enhancement type MOSFETs 141, 142, 143 and 144, as shown. The transistors 141 and 142 are connected in series between the power sources VD and VS. These transistors receive control signals F11 and F12 at the gates. The junction between these transistors is supplied with a signal Ai. Similarly, the transistors 143 and 144 are connected in series between the power sources VD and VS. These transistors receive the control signals F12 and F11 at their gates. The junction between these transistors 143 and 144 is supplied with a signal $\overline{Ai}$. The circuit shown in FIG. 19 is can be easily adapted for an embodiment shown in FIG. 20, to be described later. The fixing circuit of FIG. 19 may be substituted by the address data fixing circuit shown in FIG. 5. In the embodiment of FIG. 18, it is preferable to use the FIG. 5 circuit rather than the FIG. 19 circuit. In the memory device arranged as shown in FIG. 18, when an error bit cell is not contained in the main memory 36 (not shown in FIG. 18) the address data fixing circuit is not operated. Therefore, the MOSFETs $133_0$ to $133_n$ are all turned on and MOSFETs $134_0$ to $134_{n-1}$ are all turned off. Accordingly, the address data supplied to the MOSFETs $134_0$ to $134_{n-1}$ are transmitted through the MOSFETs $133_0$ to $133_n$ in an ON state to the corresponding input terminals of the address buffers $132_0$ to $132_n$. The address buffers $132_0$ to $132_n$ respectively produce the pairs of the address data A0, $\overline{A0}$, ..., An, $\overline{An}$ which are complementary to the input address data. The output address data are input to the address decoder 31. The address decoder 31 selects a proper one of the row lines W1, ..., Wn of the main memory 36 according to the address data.

When a memory bit cell at a point X in FIG. 4 is an error bit cell, the control signal F12 is set at logical "1" in an address fixing circuit of the address buffer circuit $132_n$. Then, the bit An is logical "0", and $\overline{An}$ is logical "1" irrespective of the contents of the address data supplied to the pin $131_n$. At this time, a memory bit cell in the memory area selected by An=logical "1". Therefore, in this case, the main memory 36 may be used as a memory with a memory capacity half that of the same memory having no error bit cell.

Let us consider a case where error bit cells are present in both memory areas specified by An=logical "1" and An=logical "0". Since an area of Y is located within the memory area selected by An=logical "0", all the MOSFETs $133_0$ to $133_n$ are turned off and all the MOSFETs $134_0$ to $134_{n-1}$ are turned on. In order to set these transistors to these states, the interconnection wires 135 and 136 are separated from the MOSFETs 137 and 139. In particular, the interconnection wires 135 and 136 are made of polysilicon or aluminum and a laser beam is applied at the proper location between the MOSFETs 137 and $133_0$ and between the MOSFETs 139 and 140, thereby cutting off these wires. Then the wire 135 which has been kept at logical "1" becomes logical "0". On the other hand, the wire 136 which has been kept at logical "0" becomes logical "1". Accordingly, MOSFETs $133_0$ to $133_n$ are all turned off and MOSFETs $134_0$ to $134_n$ are all turned on. Accordingly, the address data A0 to An-1 supplied to the pins $131_0$ to $131_{n-1}$ are transmitted to the input terminals of the address buffers $132_1$ to $132_n$, which are one higher than the input address data, through the MOSFETs $134_0$ to $134_{n-1}$.

The transmission paths of the address data A0 to An-1 are changed to those one bit higher than the former ones. The address data An-1 is input to the address buffer $132_n$ corresponding to the bit An. Therefore, in this case, the pin $131_n$ is not used.

Together with this operation, by setting up F11=logical "1" in the address buffer $132_0$ corresponding to the bit "A0" for selecting the memory area containing the error bit cell, the bits A0 and $\overline{A0}$ are fixed at "1" and "0" to prevent an area specified by A0="0" from being selected.

Through this sequence of operation, although the output of the address buffer $132_0$ corresponding to the bit A0 is actually fixed, it appears as if the bit An is fixed, when externally observed. Thus, the main memory 36 containing an error bit cell may be used as a memory with half the memory capacity.

Let us consider a case where memory bit cells at points Z and Z' in FIG. 4 are both error bit cells. In this case, the points Z and Z' are within the memory area specified by An-1="0", as seen from FIG. 4. Accordingly, the MOSFETs $133_0$ to $133_{n-2}$ are set in an ON state, the MOSFETs $134_0$ to $134_{n-2}$ are set in an OFF state, and the MOSFETs $134_{n-1}$ are set in an ON state. For this setting, the interconnection wires 135 and 136 between the MOSFETs $133_{n-2}$ and $133_{n-1}$ and between the gates of the MOSFETs $134_{n-2}$ and $134_{n-1}$ are irradiated with a laser beam and are cut off at proper locations. As a result of the cutting off, the gates of the MOSFETs $133_{n-1}$ and $133_n$ are logical "0", while the gate of the MOSFET $134_{n-1}$ is logical "1". Accordingly, the MOSFETs $133_{n-1}$ and $133_n$ and the MOSFET $134_{n-1}$ are turned off. The address data A0 to An-2 supplied to the pins $131_0$ to $131_{n-2}$ are transferred through the MOSFETs $133_0$ to $133_{n-2}$ to the input terminals of the corresponding address buffers $132_0$ to $132_{n-2}$, respectively. The address data An-1 supplied to the pins $131_{n-1}$ is transmitted through the MOSFET $134_{n-1}$ to the input terminal of the address buffer $132_n$ which is one bit higher than the address data.

Together with the operation, when the control signal F11 in the fixing circuit in the address buffer $132_{n-1}$ corresponding to the bit An-1, which specifies the memory area containing the error bit cell, is set to "1", F11="1", thereby preventing the area specified by An-1="0".

Through this sequence of operation, although the output signal of the address buffer $132_{n-1}$ corresponding to the bit An-1 is actually fixed, it appears as if the bit An of the address data is fixed, when externally viewed. Accordingly, in this case, the memory 36 is used as a memory having half the memory capacity. Also in this case, the pin $131_n$ is not used.

As seen from the above description, in the above-mentioned embodiment, when an error bit cell is produced in an area specified by a single address "1" or "0", the main memory containing the error bit may be used as a memory with a memory capacity which is half that of the memory when it has no error bit cell. Further, there is no need for changing the pin arrangement, and the pin at the most significant bit is not used.

Figure 20:
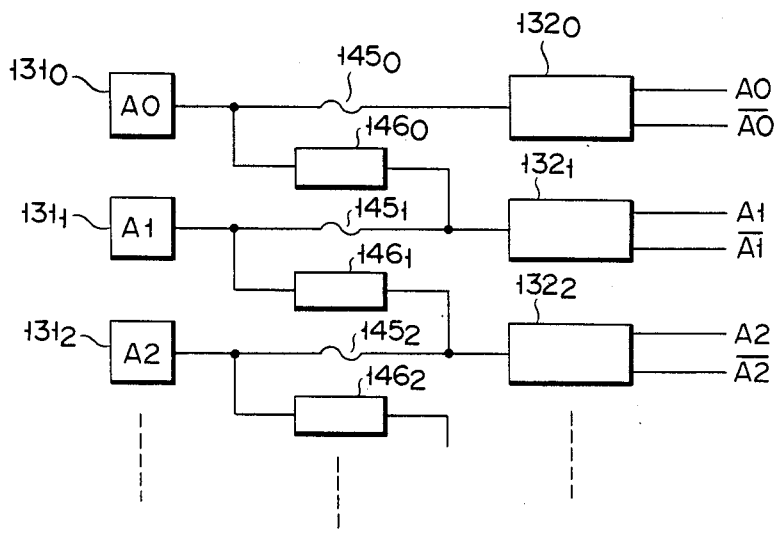

FIG. 20 shows a circuit diagram of still another embodiment of the present invention. In the embodiment shown in FIG. 18, the change of the signal transfer path between the pins $131_0$ to $131_n$ and the address buffers $132_0$ to $132_n$ is performed using the combination of the MOSFETs $133_0$ to $133_n$ and $134_0$ to $134_{n-1}$. In this embodiment, the transfer path change is made by using fuses and resistive elements made of polysilicon. As shown, inserted between pins $131_0$ to $131_n$ and address buffers $132_0$ to $132_n$ are fuses $145_0$ to $145_n$ in series. Also inserted between the pins $131_0$ to $131_{n-1}$ and the input terminals of the address buffers $132_1$ to $132_n$ which are located one bit higher than the former, are resistors $146_0$ to $146_{n-1}$ made of polysilicon which has no impurity diffused in an initial state and exhibits a high resistance.

In order to change the transmission path in this circuit, all one has to do is to burn out the fuses corresponding to the error bit cell and the bit of a higher order than the error bit, and reduce the impurities in the resistive elements corresponding to the pin specified by the error bit cell and the pin of a high order than the pin specified by the error bit cell.

FIG. 21 shows a circuit diagram illustrating an arrangement of yet another embodiment of the present invention. The embodiments shown in FIGS. 13 and 20 are arranged so as to change the transfer path between the pins $131_0$ to $131_n$ and the address buffers $132_0$ to $132_n$. In this embodiment, the address buffers $132_0$ to $132_n$ are supplied with corresponding address data, and a transfer path changing means is provided between each address buffer $132_0$ to $132_n$ and the address decoder (not shown) connected to the output of each of the buffers.

The address buffers $132_0$ to $132_n$ each have two output terminals. Therefore, two sets of MOS transistor groups and two sets of interconnection wires are respectively provided for the output terminals of the buffers, as shown. More particularly, the output terminals of the buffers are connected to a group of transistors $151_{10}$ to $151_{1n-1}$ and a group of transistors $152_{10}$ to $152_{1n-1}$, and to interconnection wires $153_1$ and $154_1$. Similarly, the other output terminals of the same are connected to a group of transistors $151_{20}$ to $151_{2n}$ and a group of transistors $152_{20}$ to $152_{2n-1}$, and to interconnection wires $153_2$ and $154_2$. The groups of transistors $151_{10}$ to $151_{1n}$ and $151_{20}$ to $151_{2n}$ correspond to the transistors $133_0$ to $133_n$ and the groups of transistors $152_{10}$ to $152_{1n-1}$ and $152_{20}$ to $152_{2n-1}$ correspond to the transistors $134_0$ to $134_{n-1}$ in FIG. 18. The interconnection wire layers $153_1$ and $153_2$ substantially correspond to the wire layer 135 in the embodiment of FIG. 18, and the wire layers $154_1$ and $154_2$ substantially correspond to the wire layer 136 in the embodiment of FIG. 18. The FIG. 18 embodiment changes the data transfer path between the address data input terminal and the address buffer. On the other hand, the present embodiment changes the data transfer path between the address buffer and the address decoder. The changing operations of both the embodiments are substantially the same. Note here that the present embodiment needs address fixing circuits, as shown in FIG. 19, provided at the output terminals of the MOSFETs $151_{10}$ to $151_{1n}$ and $151_{20}$ to $151_{2n-1}$ as the address data output terminals. It is evident that the present embodiment, like the FIG. 18 embodiment, also has the useful effect that the main memory containing an error bit may be used as a memory with half the normal memory capacity.

While the present invention has been described by referring to specific embodiments, it may be variously changed and modified without altering the spirit and scope of the invention.

What we claim is:

1. A semiconductor memory device comprising:
a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell;
means for preventing said decoder from accessing the error bit cell in said main memory; and
level holding means which is coupled between a junction of said impedance means and said auxiliary memory and a reference potential, and keeps a signal level at said junction at a nonselect level for said auxiliary memory when said main memory is selected, and keeps the signal level at said junction at a select level for said auxiliary memory when said auxiliary memory is selected.

2. A semiconductor memory device according to claim 1, wherein said level holding means is made of a MOS transistor of which the drain-source path is connected between said junction and said reference potential.

3. A semiconductor memory device according to claim 2, wherein said MOS transistor is of the depletion type.

4. A semiconductor memory device according to claim 1, wherein said level holding means is made of high resistance polysilicon.

5. A semiconductor memory device according to claim 1, wherein said level holding means includes a first MOS transistor of which the drain-source path is connected at one end to a power source potential, a first inverter provided between the power source potential and the reference potential, the output terminal of said first inverter being connected to the other end of the source-drain path of said first MOS transistor, a second inverter provided between the power source and the reference potential, the input terminal of said second inverter being connected to the other end of said first MOS transistor, the output terminal thereof being connected to the input terminal of said first inverter, a second MOS transistor whose drainsource path is connected at one end to the power source via a further provided impedance element and at the other end to the reference potential, the gate of said second MOS transistor being connected to said output terminal of said second inverter, a first capacitor element connected between said power source potential and the gate of said second MOS transistor, a third MOS transistor of which the drain-source path is connected between the gate of said second MOS transistor and said reference potential, a third inverter provided between said power source potential and said reference potential, said third inverter being connected at the input terminal to a junction of said further provided impedance means and said second MOS transistor and to the gate of said third MOS transistor, and being connected at the output terminal to the gate of said first MOS transistor, and a second capacitor element connected between said third input terminal and said reference potential, and a fourth MOS transistor whose drainsource path is connected at one end to a junction of said impedance means and said auxiliary memory and is connected at the other end to said reference potential, and is connected at the gate to said output terminal of said third inverter.

6. A semiconductor memory device comprising:
a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell; and
means for preventing said decoder from accessing the error bit cell in said main memory, said error bit cell access preventing means having a fusible element inserted between said decoder and said main memory, and circuit means for fusing said fusible element by flowing current to said fusible element, said fusing circuit means comprising a first MOS transistor of which the drain-source path is connected between one end of said fusible element closer to said main memory and a high potential power source and the gate is connected to said high potential power source, a first inverter of which the input terminal is connected to the other end of said fusible element closer to said decoder, a second inverter composed of second and third MOS transistors connected in series between said high potential power source and said reference potential, the input terminal of the second inverter being connected to the output terminal of said first inverter, and a fourth MOS transistor of which the drain-source path is connected between one end of said fusible element and said reference potential and the gate is connected to the output terminal of said inverter.

7. A semiconductor memory device comprising:
a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell;
means for preventing said decoder from accessing the error bit cell in said main memory, said error bit cell access preventing means comprising a buffer inserted in a signal transfer path between said decoder and said main memory, said buffer comprising a first inverter composed of first and second complementary MOS transistors provided between said power source potential and said reference potential, the input terminal of said first inverter being connected to one end of said signal transfer means closer to said decoder, a third MOS transistor whose drain-source path is connected between the output terminal of said first inverter and said power source potential, a second inverter composed of fourth and fifth complementary MOS transistors provided between said power source potential and said reference potential, the input terminal of the second inverter being connected to the output terminal of said first inverter, the output terminal of said second inverter being connected to the other end of said signal transfer path closer to the said main memory, a sixth MOS transistor whose drain-source path is connected between said first inverter and said reference potential, and a third inverter composed of seventh and eighth complementary MOS transistors provided between said power source potential and said reference potential, the input terminal of said third inverter being connected to a junction of said impedance means and said auxiliary memory, and the output terminal of said third inverter being connected to the gates of said third and sixth MOS transistors.

8. A semiconductor memory device comprising:
a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell;
means for preventing said decoder from accessing the error bit cell in said main memory, said error bit cell access preventing means comprising a buffer inserted in a signal transfer path between said decoder and said main memory, said buffer comprising a first inverter composed of first depletion and second enhancement type MOS transistors provided between said power source potential and said reference potential, the input terminal of said first inverter being connected to one end of said signal transfer path closer to said decoder, a third MOS transistor connected between said first inverter and said reference potential, fourth to sixth MOS transistors connected in series between said power source potential and said reference potential said fourth MOS transistor being located closest to said power source potential, the gate of said fifth MOS transistor being connected to the end of said signal transfer path closer to said decoder, and the gate of said sixth MOS transistor being connected to a junction of said first and second MOS transistors, a second inverter composed of depletion and enhancement type seventh and eighth MOS transistors provided between said power source potential and said reference potential, the input terminal of said second inverter being connected to a junction of said impedance means and said auxiliary memory, and the output terminal of said second inverter being connected to the gate of said third MOS transistor and the gate of said fourth MOS transistor.

9. A semiconductor memory device comprising:
a main memory;
a decoder for accessing said main memory;
an auxiliary memory;
impedance means provided between said decoder and said auxiliary memory, said impedance means comprising a first MOS transistor whose drain-source path is connected between said decoder and said auxiliary memory;
means for changing impedance of said impedance means for accessing said auxiliary memory when said main memory contains an error bit cell, said impedance changing means comprising a second MOS transistor connected between a polysilicon connected between said power source potential and the gate of said first MOS transistor, and said reference potential, and means for reducing a resistance of said polysilicon; and
means for preventing said decoder from accessing the error bit cell in said main memory.

10. A semiconductor memory device according to claim 9, wherein said second MOS transistor of said impedance changing means of the depletion type, and its gate are connected to said reference potential.

11. A semiconductor memory device according to claim 9, wherein said means for reducing the resistance of said polysilicon anneals said polysilicon.

12. A semiconductor memory device according to claim 11, wherein said annealing means irradiates said polysilicon with a laser beam.

13. A semiconductor memory device comprising:
a main memory;
a decoder for accessing said main memory;
an auxiliary memory;
impedance means provided between said decoder and said auxiliary memory, said impedance means comprising a first MOS transistor whose drain-source path is connected between said decoder and said auxiliary memory;
means for changing impedance of said impedance means for accessing said auxiliary memory when said main memory contains an error bit cell, said impedance changing means comprising a second MOS transistor whose drain-source path is connected at one end to said power source potential and at the other end to the gate of said first MOS transistor and said reference potential, and means for rendering nonconductive a path between said second MOS transistor and said reference potential; and
means for preventing said decoder from accessing the error bit cell in said main memory.

14. A semiconductor memory device according to claim 13, wherein said second MOS transistor of said impedance changing means is of the depletion type, and its gate is connected to said reference potential.

15. A semiconductor memory device according to claim 13, wherein said means for rendering nonconductive said second MOS transistor reference path cuts off an interconnection wire layer between said second MOS transistor and said reference potential.

16. A semiconductor memory device according to claim 15, wherein said interconnection wire layer cutting means irradiates said interconnection wire layer with a laser beam.

17. A semiconductor memory device comprising:
a main memory;
a decoder for accessing said main memory;
an auxiliary memory;
impedance means provided between said decoder and said auxiliary memory;
means for changing impedance of said impedance means for accessing said auxiliary memory when said main memory contains an error bit cell;
means for preventing said decoder from accessing the error bit cell in said main memory;
auxiliary buffer means connected between said impedance means and said auxiliary memory, said auxiliary buffer means comprising a first inverter composed of first and second complementary MOS transistors provided between said power source potential and said reference potential, the input terminal of said inverter being connected to a junction between said first and second MOS transistors, and a second inverter composed of third and fourth complementary MOS transistors connected between said power source potential and said reference potential, the input terminal of said second inverter being connected to the output terminal of said first inverter, the output terminal of said second inverter being connected to said auxiliary memory.

18. A semiconductor memory device comprising:
a main memory;
a decoder for accessing said main memory;
a plurality of transfer paths provided between said decoder on the one hand and said main memory and said auxiliary memory on the other hand;
first switch means provided between the input and output of each of said transfer paths, said first switch means being in a closed state, said first switch means comprising a first MOS transistor whose drain-source path is connected between said input and output of said transfer path;
second switch means provided between the input of one of each of said transfer paths and the output of an adjacent transfer path, said adjacent transfer path being displaced by one bit, the second switch means being in an open state, said second switch means comprising a second MOS transistor whose drain-source path is connected to the inputs and outputs of said two adjacent transfer paths; and
circuit means for setting in an open state those of said plurality of first switch means which are provided to those of the transfer paths which are between a given transfer path connected to said main memory and the transfer path connected to said auxiliary memory, and for setting in a closed state those of said plurality of second switch means which are provided between said transfer paths, said circuit means comprising a first conductive layer connected at one end to a power source providing a potential to turn on said first MOS transistor through a third MOS transistor and at the other end to said reference potential power source through a fourth MOS transistor, and a second conductive layer commonly connecting the gates of said second MOS transistors and connected at one end closer to said auxiliary memory to a power source providing a potential to turn on said second MOS transistors through a fifth MOS transistor and connected at the other end to said reference potential through a sixth MOS transistor.

19. A semiconductor memory device according to claim 18, wherein said third to sixth MOS transistors of said first circuit means are of the depletion type.

20. A semiconductor memory device according to claim 18, wherein said third, fourth, fifth and sixth MOS transistors of said first circuit means have a complementary configuration.

21. A semiconductor device comprising:

a plurality of transfer paths through which bit signals of an address signal are transferred;

a plurality of first switch means, one inserted in each of said transfer paths;

a plurality of second switch means, one connected between the input of one of two adjacent transfer paths and the output of the other of said adjacent transfer paths;

a first circuit line connected to control terminals of said first switch means and connected to a first predetermined potential; and a second circuit line connected to control terminals of said second switch means and connected to a second predetermined potential.

* * * * *